US007857985B2

(12) United States Patent
Yamashita et al.

(10) Patent No.: US 7,857,985 B2
(45) Date of Patent: Dec. 28, 2010

(54) METAL-POLISHING LIQUID AND CHEMICAL MECHANICAL POLISHING METHOD USING THE SAME

(75) Inventors: Katsuhiro Yamashita, Shizuoka-ken (JP); Kenji Takenouchi, Kanagawa (JP); Tomoo Kato, Shizuoka-ken (JP); Yoshinori Nishiwaki, Shizuoka-ken (JP); Mihoko Ishima, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 697 days.

(21) Appl. No.: 11/699,406

(22) Filed: Jan. 30, 2007

(65) Prior Publication Data
US 2007/0186484 A1 Aug. 16, 2007

(30) Foreign Application Priority Data

| Jan. 30, 2006 | (JP) | ............................. 2006-021511 |
| Feb. 8, 2006 | (JP) | ............................. 2006-031243 |
| Feb. 17, 2006 | (JP) | ............................. 2006-041363 |
| Mar. 6, 2006 | (JP) | ............................. 2006-060247 |

(51) Int. Cl.
*C03C 15/00* (2006.01)
*C03C 25/68* (2006.01)

(52) U.S. Cl. .................. 216/89; 252/79.1; 438/692; 51/309

(58) Field of Classification Search ................. 252/79.1; 216/89; 438/692; 51/309
See application file for complete search history.

(56) References Cited

U.S. PATENT DOCUMENTS

| 3,922,393 A * | 11/1975 | Sears, Jr. .................... 427/215 |
| 4,673,524 A | 6/1987 | Dean |
| 4,944,836 A | 7/1990 | Beyer et al. |
| 5,545,429 A | 8/1996 | Booth et al. |
| 5,795,695 A | 8/1998 | Malhotra et al. |
| 6,301,770 B1 | 10/2001 | McIlwraith |
| 6,485,812 B1 | 11/2002 | Sekiguchi |
| 6,527,818 B2 | 3/2003 | Hattori et al. |
| 6,565,619 B1 | 5/2003 | Asano et al. |
| 6,893,476 B2 | 5/2005 | Siddiqui et al. |
| 7,118,685 B1 | 10/2006 | Yoneda et al. |
| 7,153,335 B2 | 12/2006 | Siddiqui et al. |
| 7,300,480 B2 | 11/2007 | Bian et al. |
| 7,309,684 B2 | 12/2007 | Filippini et al. |
| 7,514,363 B2 | 4/2009 | Banerjee et al. |
| 7,527,861 B2 | 5/2009 | Li et al. |
| 7,547,670 B2 | 6/2009 | Gross et al. |
| 7,604,751 B2 | 10/2009 | Yoneda et al. |
| 7,625,967 B2 | 12/2009 | St. Clair |
| 7,691,287 B2 | 4/2010 | Siddiqui et al. |
| 2002/0055562 A1 | 5/2002 | Butuc |
| 2003/0061766 A1 | 4/2003 | Vogt et al. |
| 2003/0157804 A1 | 8/2003 | Puppe |
| 2004/0040217 A1 | 3/2004 | Takashina et al. |
| 2004/0044116 A1 | 3/2004 | Olson et al. |
| 2004/0109853 A1 | 6/2004 | McDaniel |
| 2004/0175407 A1 | 9/2004 | McDaniel |
| 2004/0186206 A1 | 9/2004 | Yoneda et al. |
| 2004/0244300 A1 | 12/2004 | Ichiki et al. |
| 2005/0076578 A1 | 4/2005 | Siddiqui |
| 2005/0079718 A1* | 4/2005 | Siddiqui et al. ............. 438/692 |
| 2005/0090109 A1 | 4/2005 | Carter |
| 2005/0112892 A1 | 5/2005 | Chen et al. |
| 2005/0118821 A1 | 6/2005 | Minamihaba et al. |
| 2005/0142084 A1 | 6/2005 | Ganguly et al. |
| 2005/0208883 A1 | 9/2005 | Yoshida et al. |
| 2006/0117667 A1 | 6/2006 | Siddiqui et al. |
| 2006/0182788 A1 | 8/2006 | Singh et al. |
| 2006/0240672 A1 | 10/2006 | Yoneda et al. |
| 2007/0036738 A1 | 2/2007 | Fletcher et al. |
| 2007/0045233 A1 | 3/2007 | Yoneda et al. |
| 2007/0093187 A1 | 4/2007 | Takenouchi |
| 2007/0167016 A1 | 7/2007 | Yamashita |
| 2007/0176142 A1 | 8/2007 | Kikuchi |
| 2007/0181850 A1 | 8/2007 | Kamimura |
| 2007/0186484 A1 | 8/2007 | Yamashita et al. |
| 2007/0275021 A1 | 11/2007 | Lee et al. |

(Continued)

FOREIGN PATENT DOCUMENTS

EP 1813656 A2 8/2007

(Continued)

OTHER PUBLICATIONS

Haba, S. et al., "Metal-film Abrasive Compound for Polishing," Derwent Information Ltd., 2009, pp. 1-8.

(Continued)

*Primary Examiner*—Roberts Culbert
(74) *Attorney, Agent, or Firm*—Sughrue Mion, PLLC

(57) ABSTRACT

The invention provides a metal polishing liquid comprising an oxidizing agent and colloidal silica in which a part of a surface of the colloidal silica is covered with aluminum atoms, and a Chemical Mechanical Polishing method using the same. An amino acid, a compound having an isothiazoline-3-one skeleton, an organic acid, a passivated film forming agent, a cationic surfactant, a nonionic surfactant, and a water-soluble polymer may be contained. A metal polishing liquid which is used in Chemical Mechanical Polishing in manufacturing of a semiconductor device, attains low dishing of a subject to be polished, and can perform polishing excellent in in-plane uniformity of a surface to be polished.

5 Claims, No Drawings

U.S. PATENT DOCUMENTS

| | | |
|---|---|---|
| 2008/0057336 A1 | 3/2008 | Kurokawa et al. |
| 2008/0057716 A1 | 3/2008 | Yamashita |
| 2008/0182485 A1 | 7/2008 | Siddiqui et al. |
| 2009/0258060 A1 | 10/2009 | Cleary et al. |

FOREIGN PATENT DOCUMENTS

| | | |
|---|---|---|
| JP | 49-122432 A | 11/1974 |
| JP | 63-123807 A | 5/1988 |
| JP | 2-278822 A | 11/1990 |
| JP | 6-199515 A | 7/1994 |
| JP | 8-83780 A | 3/1996 |
| JP | 11-186202 A | 7/1999 |
| JP | 2000084832 | 3/2000 |
| JP | 2001-127019 A | 5/2001 |
| JP | 2001-139935 A | 5/2001 |
| JP | 2001-279231 A | 10/2001 |
| JP | 2003017446 | 1/2003 |
| JP | 2003142435 | 5/2003 |
| JP | 2003-197573 A | 7/2003 |
| JP | 2003-244092 A | 8/2003 |
| JP | 2005-142542 A | 6/2005 |
| JP | 2005-159269 A | 6/2005 |
| JP | 2005-167204 A | 6/2005 |
| JP | 2005-175218 A | 6/2005 |
| JP | 2005-177970 A | 7/2005 |
| JP | 2008-512871 A | 4/2008 |
| WO | 0104231 A1 | 1/2001 |
| WO | 2004/101221 A | 11/2004 |
| WO | 2004101221 A2 | 11/2004 |

OTHER PUBLICATIONS

European Search Report issued in counterpart EP 07002005.2 dated Jul. 30, 2009.

Japanese Office Action issued in corresponding Japanese Application No. 2006-021511, dated Oct. 26, 2010.

* cited by examiner

METAL-POLISHING LIQUID AND CHEMICAL MECHANICAL POLISHING METHOD USING THE SAME

CROSS REFERENCES TO RELATED APPLICATIONS

This invention claims priority under 35 USC 119 from Japanese Patent Application Nos. 2006-021511, 2006-031243, 2006-041363 and 2006-060247, the disclosure of which is incorporated by reference herein.

BACKGROUND OF THE INVENTION

1. Field of the Invention

The present invention relates to a manufacturing process of a semiconductor device and, particularly, it relates to a metal-polishing liquid in a wiring process of a semiconductor device.

2. Description of the Related Art

In development of a semiconductor device, a representative of which is a semiconductor integrated circuit (hereinafter, referred to as LSI), for miniaturization and speeding up, densification and higher integration by finer downsizing and lamination of a wiring are required and, in recent years, as a metal for wiring, LSI using copper having a low wiring resistance has been developed and, as the technique therefore, various techniques such as Chemical Mechanical Polishing (hereinafter, referred to as CMP) have been used.

CMP is the technique for planarizing irregularities on a wafer surface produced by lamination. A general method of CMP is to apply a polishing pad on a circular polishing platen, impregnate a polishing pad surface with a polishing liquid, push a surface of a substrate (wafer) against a pad and, in the state where a predetermined pressure (polishing pressure) is applied from a back, rotate both of a polishing platen and a substrate, and flatten a surface of a substrate by a generated mechanical friction.

A metal-polishing liquid used in CMP generally contains abrasives (e.g. alumina, silica) and an oxidizing agent (e.g. hydrogen peroxide, persulfuric acid), and it is thought that a substrate surface is polished by oxidizing a metal surface with an oxidizing agent and removing the oxidized film with abrasives.

However, when CMP is performed using such the metal-polishing liquid containing solid abrasives, a polishing flaw (scratch), phenomenon in which a whole polishing surface is polished more than necessary (thinning), phenomenon in which a polishing metal surface is not planar, only a central part is polished deeper, and a dish-like recess is produced (dishing), and phenomenon in which an insulating material between metal wirings is polished more than necessary, and a plurality of wiring metal surfaces form a dish-like concave part (erosion) occur in some cases. Particularly, in recent years, for further higher densification and higher integration, reduction in dishing is increasingly demanded. In addition, recently, for improving productivity, a wafer diameter at LSI manufacturing is being scaled up and, currently, a diameter of 200 mm or more is generally used, and manufacturing at a size of 300 mm or more has been began. With such the scale up, a difference in a polishing rate between a central part and a circumferential part of a wafer becomes larger, and improvement in in-planar uniformity has been increasingly demanded. Further, recently, in order that film peeling is not caused even when an insulating material having a low mechanical strength is used, a method by which a sufficient polishing rate is obtained even when polishing is performed under a low pressure is desired. In order to solve such the problems, a metal polishing liquid consisting of hydrogen peroxide/malic acid/benzotriazole/polyammonium acrylate and water without an abrasive has been proposed (e.g. see Japanese Patent Application Laid-Open (JP-A) No. 2001-127019). According to this method, a conductor pattern in which a metal film remains on a concave part is obtained, but there is a problem that a sufficient polishing rate is difficult to obtain.

On the other hand, a polishing agent containing an abrasive has a problem that although a high polishing rate is obtained, aggregation of abrasives occurs during polishing, and a polishing rate is lowered due to the aggregation.

SUMMARY OF THE INVENTION

The present invention has been made in view of the above circumstances and provides metal-polishing liquid and chemical mechanical polishing method using the same.

A first aspect of the invention provides a metal polishing liquid comprising an oxidizing agent and colloidal silica in which at least a part of a surface of the colloidal silica is covered with aluminum atoms.

DETAILED DESCRIPTION

The present inventors discovered that grinding products generated during a polishing process provoke an aggregation of abrasives and that the aggregation of abrasives decreases the stability of the polishing rate. In view of the above problem, an object of the present invention is to provide a metal polishing composition, wherein an aggregation of abrasives caused by grinding products from polishing is suppressed and a stable high polishing rate can be obtained even when the process fluctuates.

Specific aspects of the invention will be explained below.

A metal polishing liquid of the invention contains colloidal silica in which at least a part of silicon atoms on a surface is covered with aluminum atoms and, if necessary, other compound.

First, colloidal silica which is a characteristic component of the invention will be explained.

<Colloidal Silica in Which at Least a Part of Silicon Atoms on a Surface is Covered with Aluminum Atoms>

Colloidal silica used in the invention functions as an abrasive in the metal polishing liquid of the invention and, hereinafter, in the present specification, is conveniently referred to as specified colloidal silica.

In the invention, the "colloidal silica in which at least a part of silicon atoms on a surface is covered with aluminum atoms" means the state where an aluminum atom is present on a colloidal silica surface having a site containing a silicon atom having a coordination number of 4, may be the state where an aluminum atom coordinated with four oxygen atoms is bound to a surface of the colloidal silica, and an aluminum atom is fixed in the four coordination to produce a new surface, or may be the state where a new surface is produced in which a silicon atom present on a surface is once extracted, and is covered with an aluminum atom.

As colloidal silica used in preparing specified colloidal silica, colloidal silica containing no impurity such as an alkali metal in the interior of a particle, which is obtained by hydrolysis of alkoxysilane, is more preferable. A particle diameter of colloidal silica as a raw material is appropriately selected depending on the use object of an abrasive, and is generally around 10 to 200 nm.

As a method of obtaining such the specified colloidal silica by covering at least a part of a surface of the colloidal silica with aluminum atoms, for example, a method of adding an aluminate compound such as sodium aluminate to a dispersion of colloidal silica can be preferably used. This method is described in detail in Japanese Patent No. 3463328, and JP-A No. 63-123807 and the description may apply to the present invention.

Aluminum alkoxide used herein may be any aluminum alkoxide, and is preferably aluminum isopropoxide, aluminum buoxide, aluminum methoxide, or aluminum ethoxide, particularly preferably, is aluminum isoproxide or aluminum butoxide.

An aluminosilicate site produced by a reaction between a four coordination alminate ion and a silanol group on a colloidal silica surface fixes a negative charge to give a negative great zeta potential to a particle, thereby, specified colloidal silica is excellent in dispersity even in acidity. Therefore, it is important that specified colloidal silica produced by the aforementioned method is present in the state where an aluminum atom is coordinated with four oxygen atoms.

Production of such the structure, that is, substitution of a silicon atom with an aluminum atom on a colloidal silica surface can be easily confirmed, for example, by measuring a zeta potential of an abrasive.

An amount of covering with aluminum is expressed by a surface atom covering rate (number of introduced aluminum atoms/number of surface silicon atom sites) of colloidal silica. This surface atom covering rate is preferably 0.001% or more and 50% or less, further preferably 0.01% or more and 25% or less, particularly preferably 0.1% or more and 10% or less.

In the event that a colloidal silica surface is covered by aluminum atoms, this surface atom covering rate can be appropriately controlled by controlling an addition amount (concentration) of an aluminum compound or aluminum alkoxide to be added to a dispersion of colloidal silica as a raw material.

Herein, postulating that this consumed aluminum-based compound has reacted 100%, a surface atom covering rate (number of introduced aluminum atoms/number of surface silicon atom sites) of specified colloidal silica can be estimated from a surface area calculated from a diameter of colloidal silica, a specific gravity of colloidal silica of 2.2, and the number of silanol groups per unit surface area (5 to 8/nm$^2$). In actual measurement, the resulting specified colloidal silica itself is subjected to elementary analysis and, postulating that aluminum is not present in the interior of a particle, and is spread uniformly and thinly on a surface, the rate is obtained by using surface area/specific gravity of the colloidal silica, and the number of silanol groups per unit surface area.

As for a specific process for producing specified colloidal silica in the invention, colloidal silica is dispersed in water in a range of from 1 to 50% by mass, the pH of the dispersion is adjusted to from 7 to 11 and, thereafter, an aqueous sodium aluminate solution is added while this is stirred near a room temperature, and is stirred as it is for from 1 to 10 hours. After then impurities are removed from the thus obtained sol by ion exchange or ultrafiltration to obtain specified colloidal silica.

A primary particle diameter (volume-equivalent diameter) of the resulting specified colloidal silica is preferably from 3 to 200 nm, further preferably from 5 to 100 nm, particularly preferably from 10 to 60 nm. As a particle diameter (volume-equivalent diameter) of specified colloidal silica, a value measured by a dynamic light scattering method is adopted.

A pH of a metal polishing liquid of the invention is preferably from 2 to 7.

Of an abrasive contained in the metal polishing liquid of the invention, a proportion of a weight of specified colloidal silica is preferably 50% or more, particularly preferably 80% or more. All of an abrasive to be contained may be specified colloidal silica.

A content of specified colloidal silica in a polishing liquid upon use of a metal polishing liquid is preferably 0.001% by weight or more and 5% by weight or less, further preferably 0.01% by weight or more and 0.5% by weight or less, particularly preferably 0.05% by weight or more and 0.2% by weight or less.

The metal polishing liquid of the invention may contain, in addition to the specified colloidal silica, an abrasive other than specified colloidal silica in such a range that the effect of the invention is not deteriorated. As an abrasive which can be used herein, fumed silica, colloidal silica, ceria, alumina, and titania are preferable, and colloidal silica is particularly preferable.

A size of an abrasive other than colloidal silica in which at least a part of silicon atoms on a surface is covered with an aluminum atom is preferably equivalent to or 2-fold or less a size of the specified colloidal silica.

<Oxidizing Agent>

The metal polishing liquid of the invention contains a compound which can oxidize a metal to be polished (oxidizing agent).

Examples of the oxidizing agent include hydrogen peroxide, peroxide, nitrate, iodate, periodate, hypochlorite, chlorite, chlorate, perchlorate, persulfate, bichromate, permanganate, aqueous ozone, silver (II) salt, and iron (III) salt.

As the iron (III) salt, for example, in addition to inorganic iron (III) salts such as iron (III) nitrate, iron (III) chloride, iron (III) sulfate, and iron (III) bromide, organic complex salts of iron (III) are preferably used.

When an organic complex salt of iron (III) is used, examples of a complex forming compound constituting an iron (III) complex salt include acetic acid, citric acid, oxalic acid, salicylic acid, diethyldithiocarbamic acid, succinic acid, tartaric acid, glycolic acid, glycine, alanine, aspartic acid, thioglycolic acid, ethylenediamine, trimethylenediamine, diethyleneglycol, triethyleneglycol, 1,2-ethanedithiol, malonic acid, glutaric acid, 3-hydroxybutyric acid, propionic acid, phthalic acid, isophthalic acid, 3-hydroxysalycilic acid, 3,5-dihydroxysalycilic acid, gallic acid, benzoic acid, maleic acid and salts thereof, aminopolycarboxylic acid and salts thereof.

Examples of the aminopolycarboxylic acid and salts thereof include ethylenediamine-N,N,N',N'-tetraacetic acid, diethylenetriaminepentaacetic acid, 1,3-diaminopropane-N,N,N',N'-tetraacetic acid, 1,2-diaminopropane-N,N,N',N'-tetraacetic acid, etheylenediamine-N,N'-disuccinic acid (racemate), ethylenediaminedisuccinic acid (SS compound), N-(2-carboxylatoethyl)-L-aspartic acid, N-(carboxymethyl)-L-aspartic acid, β-alaninediacetic acid, methyliminodiacetic acid, nitrilotriacetic acid, cyclohexanediaminetetraacetic acid, iminodiacetic acid, glycol ether diaminetetraacetic acid, ethylenediamine 1-N,N'-diacetic acid, ethylenediamineorthohydroxyphenylacetic acid, N,N-bis(2-hydroxybenzyl) ethylenediamine-N,N-diacetic acid and salts thereof. A kind of a counter salt is preferably an alkali metal salt and an ammonium salt, particularly preferably an ammonium salt.

Among the oxidizing agents, hydrogen peroxide, iodate, hypochlorite, chlorate, persulfate, and an organic complex salt of iron (III) are preferable, and examples of a preferable complex forming compound when an organic complex salt of iron (III) is used include citric acid, tartaric acid, and aminopolycarboxylic acid (specifically, ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemate), ethylenediaminedisuccinic acid (SS compound), N-(2-carboxylatoethyl)-L-aspartic acid, N-(carboxymethyl)-L-aspartic acid, β-alaninediacetic acid, methyliminodiacetic acid, nitrilotriacetic acid, iminodiacetic acid).

Among the oxidizing agent, hydrogen peroxide is most preferable.

An addition amount of an oxidizing agent is preferably from 0.003 mol to 8 mol, more preferably from 0.003 mol to 6 mol, particularly preferably from 0.1 mol to 4 mol in 1 L of the metal polishing liquid when used in polishing. That is, an addition amount of the oxidizing agent is preferably 0.003 mol or more from a viewpoint that oxidation of a metal is sufficient, and a high CMP rate is maintained, and is preferably 8 mol or less from a viewpoint of prevention of roughening of a polishing surface.

<Quaternary Alkylammonium Compound>

It is preferable that the metal polishing liquid of the invention contains a quaternary alkylammonium compound in addition to the essential components.

Examples of the quaternary alkylammonium include tetramethylammonium hydroxide, tetramethylammonium nitrate, tetraethylammonium hydroxide, tetraethylammonium nitrate, and stearintrimethylammonium nitrate, particularly preferably trimethylammonium hydroxide.

A content of the quaternary alkylammonium compound is preferably 0.01% by weight or more and 20% by weight or less, further preferably 0.1% by weight or more and 5% by weight or less, particularly preferably 0.5% by weight or more and 2% by weight or less based on the metal polishing liquid.

<Compound Having at Least One Carboxyl Group and at Least One Amino Group in a Molecule>

It is preferable that the polishing composition of the invention contains a compound having at least one carboxyl group and at least one amino group in a molecule. At least one of amino groups possessed by the compound is further preferably a secondary or tertiary amino group. The compound may further have a substitutent.

The compound having at least one carboxyl group and at least one amino group in a molecule which can be used in the invention is preferably amino acid or polyamino acid, particularly suitably a compound selected from the following group.

As amino acid, α-amino acids such as glycine, alanine, valine and glutamic acid, β-amino acids such as β-alanine, iminobiacetic acid, hydroxyethyliminodiacetic acid, hydroxyethylglycine, dihydroxyethylglycine, glycylglycine, and N-methylglycine, are preferable.

The polishing composition further preferably contains two or more kinds of compounds having at least one carboxyl group and at least one amino group in a molecule and, among the compounds, particularly preferably a compound having only one carboxyl group in a molecule, and a compound having 2 or more carboxyl groups in a molecule are particularly preferably used jointly. An addition amount of a compound having at least one carboxyl group and at least one amino group in a molecule is preferably 0.1% by mass or more and 5% by mass or less, further preferably 0.5% by mass or more and 2% by mass or less.

<Heterocyclic Compound>

It is preferable that the polishing composition of the invention contains a heterocyclic compound. Specific examples of the heterocyclic compound in the invention includes the following exemplified compounds (I-1) to (I-16), (II-1) to (II-51).

(I-1)

(I-2)

(I-3)

(I-4)

(I-5)

(I-6)

(I-7)

(I-8)

(I-9)

(I-10)

(I-11)

-continued
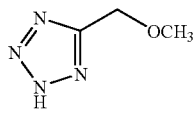 (I-12)
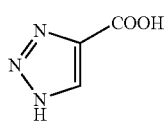 (I-13)
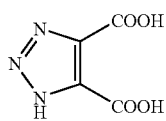 (I-14)
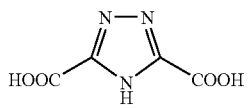 (I-15)
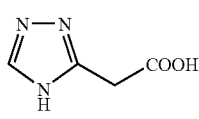 (I-16)
 (II-1)
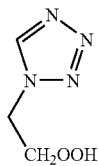 (II-2)
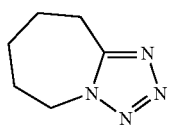 (II-3)
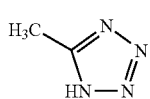 (II-4)
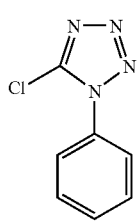 (II-5)
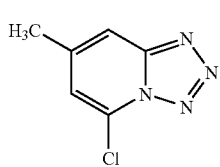 (II-6)
-continued
 (II-7)
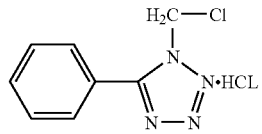 (II-8)
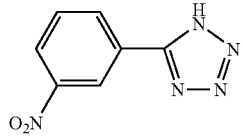 (II-9)
 (II-10)
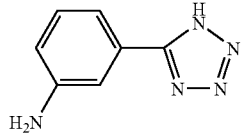 (II-11)
 (II-12)
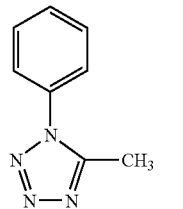 (II-13)
(II-14)

-continued
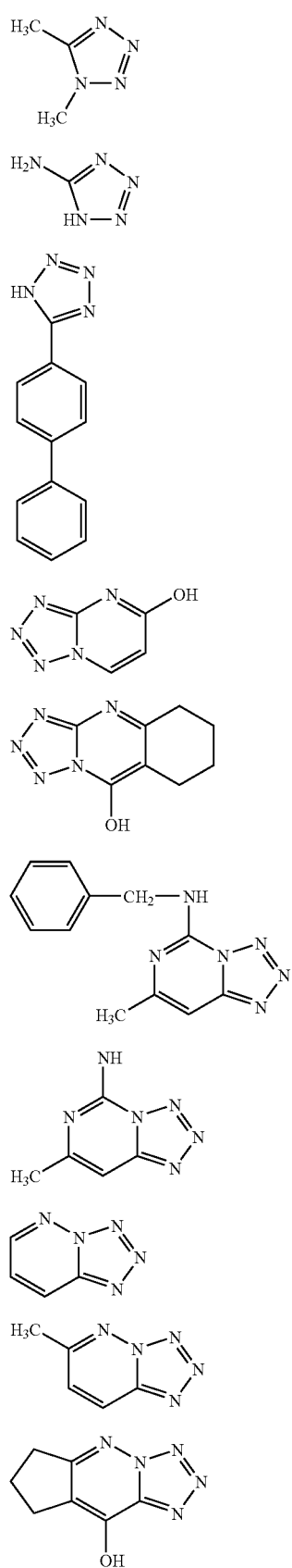
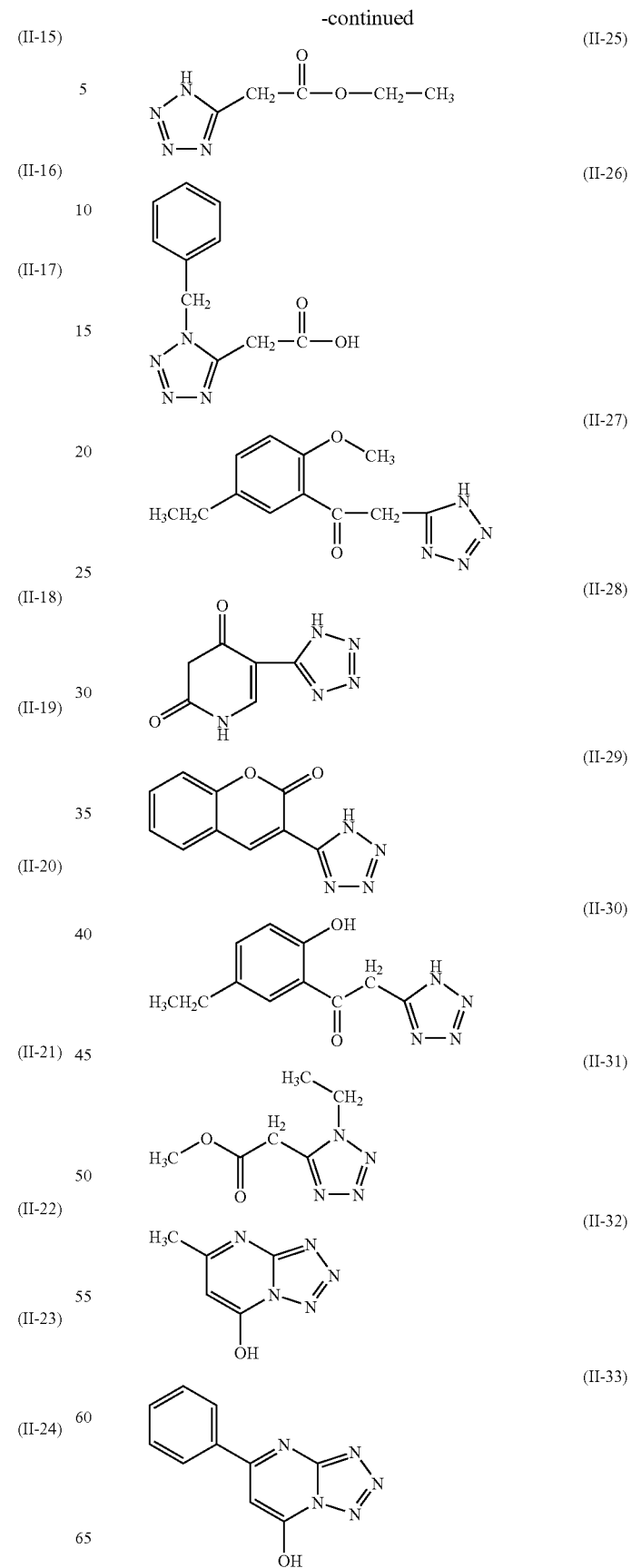

-continued

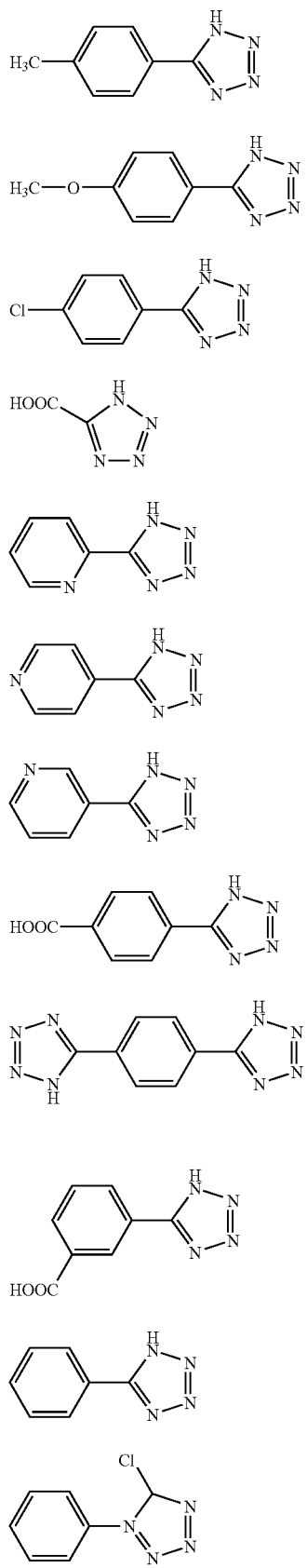
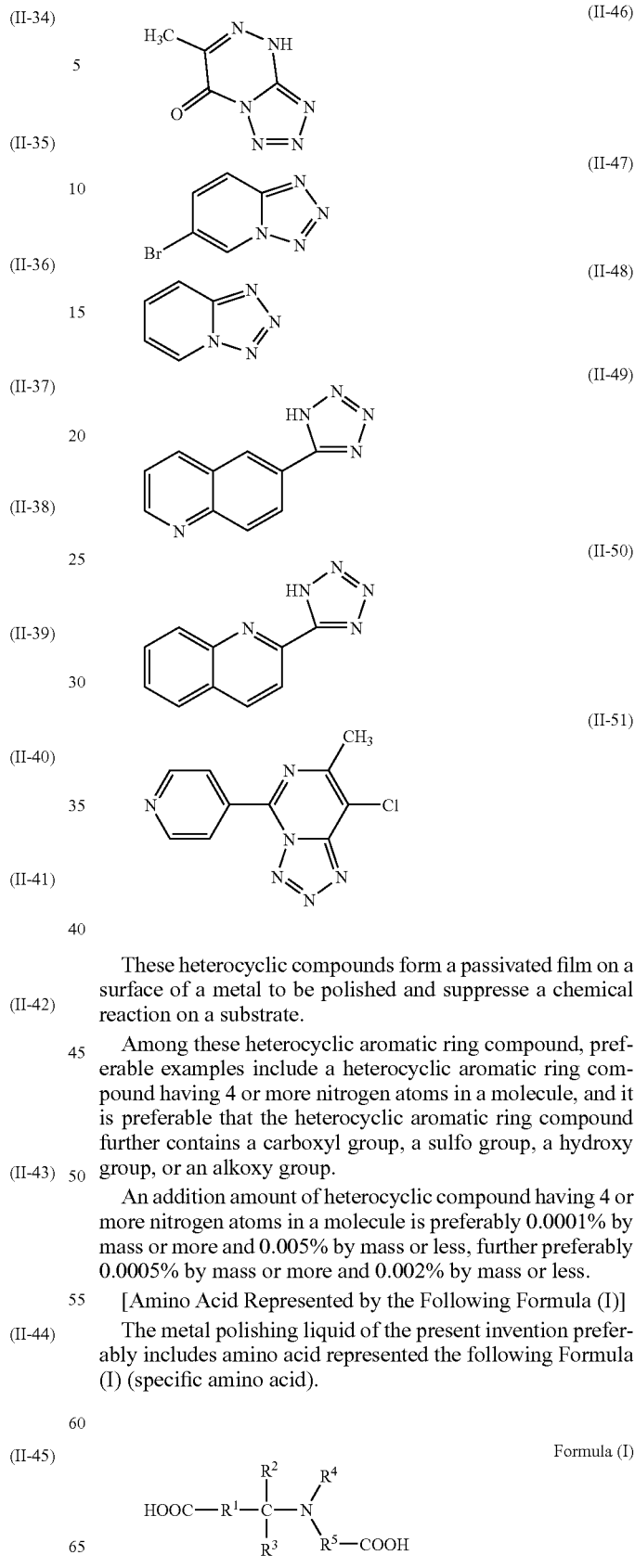

These heterocyclic compounds form a passivated film on a surface of a metal to be polished and suppresse a chemical reaction on a substrate.

Among these heterocyclic aromatic ring compound, preferable examples include a heterocyclic aromatic ring compound having 4 or more nitrogen atoms in a molecule, and it is preferable that the heterocyclic aromatic ring compound further contains a carboxyl group, a sulfo group, a hydroxy group, or an alkoxy group.

An addition amount of heterocyclic compound having 4 or more nitrogen atoms in a molecule is preferably 0.0001% by mass or more and 0.005% by mass or less, further preferably 0.0005% by mass or more and 0.002% by mass or less.

[Amino Acid Represented by the Following Formula (I)]

The metal polishing liquid of the present invention preferably includes amino acid represented the following Formula (I) (specific amino acid).

$R^1$ in the Formula (I) represents a single bond, an alkylene group or a phenylene group. $R^2$ and $R^3$ in the Formula (I) each represent independently a hydrogen atom, a halogen atom, a carboxyl group, an alkyl group, a cycloalkyl group, an alkenyl group, an alkynyl group or an aryl group. $R^4$ represents a hydrogen atom, a halogen atom, a carboxyl group, an alkyl group or an acyl group and $R^5$ represents a alkyl group.

When $R^5$ is —CH2- in Formula (I), $R^1$ is not a single bond or $R^4$ is not a hydrogen atom.

An alkylene group as $R^4$ and $R^5$ in the Formula (I) may be any of straight, branched and cyclic, preferably has a carbon number of from 1 to 8, and examples include a methylene group and an ethylene group.

Examples of a substituent which may be possessed by the alkylene group as $R^1$ and $R^5$, and the phenylene group as $R^1$ in the Formula (I) include a hydroxy group, a halogen atom.

Examples of a halogen atom as $R^2$, $R^3$ and $R^4$ in the Formula (I) include a florine atom, a chlorine atom, a bromine atom and a iodine atom.

An alkyl group as $R^2$ and $R^3$ in the Formula (I) has preferably a carbon number of 1 to 8, and examples include a methyl group and a propyl group.

A cycloalkyl group as $R^2$ and $R^3$ in the Formula (I) has preferably a carbon number of 5 to 15, and examples include a cyclopentyl group, a cyclohexyl group, and a cyclooctyl group.

An alkenyl group as $R^2$ and $R^3$ in the Formula (I) has preferably a carbon number of 2 to 9, and examples include a vinyl group, a propenyl group, and an allyl group.

An alkynyl group as $R^2$ and $R^3$ in the Formula (I) has preferably a carbon number of 2 to 9, and examples include an ethynyl group, a propynyl group, and a butynyl group.

An aryl group as $R^2$ and $R^3$ in the Formula (I) has preferably a carbon number of from 6 to 15, and examples include a phenyl group.

An alkylene chain in these groups may have a hetero atom such as an oxygen atom, and a sulfur atom.

Examples of a substituent which may be possessed by each group as $R^2$ and $R^3$ in the Formula (I) include a hydroxy group, a halogen atom, an aromatic ring (preferably a carbon number of from 3 to 15), a carboxyl group, and an amino group.

An alkyl group as $R^4$ in the Formula (I) has preferably a carbon number of from 1 to 8, and examples include a methyl group, an ethyl group.

An acyl group as $R^4$ has preferably a carbon number of from 2 to 9, and examples include a methylcarbonyl group.

An alkylene chain in these groups may have a hetero atom such as an oxygen atom, and a sulfur atom.

Examples of a substituent which may be possessed by the group as $R^4$ in the Formula (I) include a hydroxy group, an amino group, and a halogen atom.

In the Formula (I), it is preferable that $R^4$ is not a hydrogen atom.

Preferable embodiments (exemplified compound III-1 to III-12) of the amino acid (specific amino acid) represented by the Formula (I) are shown below, but embodiments are not limited to them. "—" in the embodiments means a single bond.

$$HOOC-R^1-\underset{R^3}{\underset{|}{\overset{R^2}{\overset{|}{C}}}}-\underset{R^5-COOH}{\overset{R^4}{N}}$$

| | $R^1$ | $R^2$ | $R^3$ | $R^4$ | $R^5$ |
|---|---|---|---|---|---|
| III-1 | — | —H | —H | —CH$_3$ | —CH$_2$— |
| III-2 | — | —H | —H | —CH$_2$OH | —CH$_2$— |
| III-3 | — | —H | —H | —CH$_2$CH$_2$OH | —CH$_2$— |
| III-4 | — | —H | —H | —(CH$_2$CH$_2$O)$_{10}$—H | —CH$_2$— |
| III-5 | — | —H | —CH$_3$ | —H | —CH(CH$_3$)— |
| III-6 | — | —H | —CH$_2$OH | —H | —CH(CH$_2$OH)— |
| III-7 | —CH$_2$— | —H | —H | —H | —CH$_2$— |
| III-8 | —CH$_2$— | —H | —H | —H | —CH$_2$CH$_2$— |
| III-9 | —CH$_2$— | —H | —H | —CH$_2$CH$_2$OH | —CH$_2$CH$_2$— |
| III-10 | —CH$_2$— | —H | —H | —CH$_2$COOH | —CH$_2$— |
| III-11 | — | —H | —CH$_3$ | —H | —CH$_2$CH$_2$— |
| III-12 | — | —H | —H | —H | —CH$_2$CH$_2$— |

In the invention, among the exemplified compounds, compounds (III-8), (III-10) and (III-12) are particularly preferable.

A method of synthesizing the specified amino acid is not particularly limited, and the compound can be synthesized by the known method. Alternatively, a commercially available compound may be used. In addition, specified amino acid which can be used in the invention may be used alone, or two or more kinds may be used together.

An additive amount of the specified amino acid is preferably from 0.0001 to 3 mol, more preferably from 0.005 to 1 mol, particularly preferably from 0.01 to 0.5 mol in 1 L of a metal polishing liquid upon use in polishing. That is, an addition amount of specified amino acid is preferably 0.0001 mol % or more from a viewpoint of dishing suppression, and is preferably 3 mol or less from a viewpoint of obtaining the sufficient addition effect.

<Compound Having at Least Amino Group and at Least Sulfo Group in Molecule>

It is preferable that the metal polishing liquid of the invention contains a compound having at least one amino group and at least one sulfo group in a molecule.

Examples of the compound include aminomethanesulfonic acid, and taurine. Preferable is taurine.

An addition amount of the compound having at least one amino group and at least one sulfo group in a molecule is preferably 0.1% by weight or more and 10% by weight or less, further preferably 1% by weight or more and 5% by weight or less.

<Phosphate or Phosphite>

The metal polishing liquid of the invention preferably contains a phosphate or a phosphite.

In the invention, it is preferable to set an appropriate compound spices, an addition amount, a pH and a dispersing medium, depending on adsorbability and reactivity on a polishing surface, solubility of a metal to be polished, an electrochemical nature of a surface to be polished, the dissolution state of a compound functional group, and stability as a liquid. A pH in the metal polishing liquid of the invention is preferably in a range of from 2 to 7, further preferably in a range of from 4 to 6 as described above.

The polishing liquid of the present invention contains at least one compound having an isothiazoline-3-one skeleton. Two or more compounds having an isothiazoline-3-one skeleton may be used by mixing them.

It is more preferable that the compound having an isothiazoline-3-one skeleton in the invention does not contain a halogen. The compound may be dissolved in water using a solvent.

Preferable examples of the compound having an isothiazoline-3-one skeleton include 2-methyl-4-isothiazoline-3-one (abbreviation: MIT), 5-chloro-2-methyl-4-isothiazoline-3-one (abbreviation: CIT), 2-n-octyl-4-isothiaozoline-3-one (OIT), N-n-butyl-1,2-benzoisothiazoline-3-one, 1,2-benzoisothiazoline-3-one, and 4-chloro-2-methyl-isothiazoline-3-one.

As the compound having an isothiazoline-3-one skeleton, a commercially available product can be also used, and examples include ACTICIDE manufactured by Thor, Rocima manufactured by Rohm and Haas Company, Inc., and ZONEN manufactured by Chemicrea Inc.

A content of the compound having an isothiazoline-3-one skeleton in the polishing composition in the invention is preferably from 1 to 500, more preferably from 5 to 100, particularly preferably from 10 to 50 based on 1 L of a polishing composition from a viewpoint that both of polishing performance such as a polishing rate and dishing, and a shelf life are realized.

<Cationic Surfactant, Nonionic Surfactant and Water-Soluble Polymer>

The metal polishing liquid of the invention contains at least one of a cationic surfactant, a nonionic surfactant or a water-soluble polymer. A content of the component is preferably in a range of from 0.0001% by mass to 1% by mass based on a total mass of the metal polishing liquid.

—Cationic Surfactant—

As the cationic surfactant, an aliphatic amine salt, an aliphatic quarternary ammonium salt, a benzalkonium chloride salt, a benzethonium chloride salt, a pyridinium salt, and an immidazolinium salt are preferable and, among them, an aliphatic amine salt, an aliphatic quarternary ammonium salt, and a benzalkonium chloride salt are more preferable.

An addition amount of the cationic surfactant, as a total amount, is preferably from 0.0001 to 10 g, more preferably from 0.01 to 5 g, particularly preferably from 0.1 to 3 g in 1 L of the metal polishing liquid upon use in polishing.

—Nonionic Surfactant—

Examples of the nonionic surfactant include an ether type, an ether ester type, an ester type, and a nitrogen-containing type, examples of the ether type include polyoxyethylene alkyl and alkyl phenyl ether, alkylallylformaldehyde-condensed polyoxyethylene ether, polyoxyethylene polyoxypropylene block polymer, and polyoxyethylene polyoxypropylene alkyl ether, examples of the ether ester type include polyoxyethylene ether of glycerin ether, polyoxyethylene ether of sorbitan ester, and polyoxyethylene ether of sorbitol ester, examples of the ester type include polyethylene glycol fatty acid ester, glycerin ester, polyglycerin ester, sorbitan ester, propylene glycol ester, and sugar ester, and examples of the nitrogen-containing type include fatty acid alkanol amide, polyoxyethylene fatty acid amide, and polyoxyethylene alkylamide.

An addition amount of the nonionic surfactant, as a total amount, is preferably from 0.0001 to 10 g, more preferably from 0.01 to 5 g, particularly preferably from 0.1 to 3 g in 1 L of a metal polishing liquid upon use in polishing.

—Water-Soluble Polymer—

Examples of the water-soluble polymer include polycarboxylic acid and a salt thereof such as polyacrylic acid and a salt thereof, polymethacrylic acid and a salt thereof, polyamic acid and a salt thereof, polymaleic acid, polyitaconic acid, polyphthalic acid, poly(p-styrenecarboxylic acid, and polyglyoxylic acid. Further examples include a vinyl-based polymer such as polyvinyl alcohol, polyvinylpyrrolidone and polyacrolein.

Since when a subject to be polished is a silicon substrate for a semiconductor integrated circuit, pollution with an alkali metal, an alkaline metal, or halide is not desirable, when a water-soluble polymer is an acid, it is desirable that the polymer is as an acid, or in the state of an ammonium salt thereof. As the water-soluble polymer, among the aforementioned polymers, a polyammonium acrylate salt, polyvinyl alcohol, polyvinylpyrrolidone, polyethylene glycol, polyoxyethylene polyoxypropylene block polymer are more preferable.

An addition amount of the water-soluble polymer, as a total amount, is preferably from 0.0001 to 30 g, more preferably from 0.01 to 10 g, particularly preferably from 0.1 to 3 g in 1 L of a metal polishing liquid upon use in polishing.

An addition amount of a surfactant and/or a water-soluble polymer in the invention is preferably 0.001 g or more in 1 L of a metal polishing liquid from a viewpoint that the sufficient effect is obtained, and is preferably 10 g or less from a viewpoint that reduction in a CMP rate is prevented.

A weight average molecular weight of these surfactants and/or water-soluble polymers is preferably from 50 to 100000, particularly preferably from 200 to 50000.

The surfactant in the invention may be used alone, or two or more surfactants may be used, and different kinds of surfactants may be used jointly.

In addition, an content ratio of cationic surfactant, nonionic surfactant and water-soluble polymer components to specified colloidal silica in the invention is preferably from 0.0001:1 to 1:0.001, more preferably from 0.001:1 to 1:0.01, particularly preferably from 0.005:1 to 1:0.1 as expressed by a mass ratio.

The metal polishing liquid of the invention may contain a surfactant other than the surfactant in the invention in such a range that the effect of the invention is not deteriorated.

<Chemical Mechanical Polishing Method>

Metal polishing liquid of the invention is applied to a Chemical Mechanical Polishing method (hereinafter, also referred to as "CMP method" or "polishing method") described below in detail. That is, the metal polishing liquid of the invention is contacted with a surface to be polished, and a surface to be polished and a polishing surface are subjected to a relative movement to polish a substrate on which a metal wiring was formed, thereby, at least a part of a metal is removed.

Examples of a material to be processed which is a subject to be polished include materials at all stages requiring planarization in a semiconductor device manufacturing step, such as a wafer in which an electrically conductive material film is formed on a support substrate, and a laminate in which an electrically conductive material film was formed on a low dielectric insulating film (interlayer insulating film) provided on a wiring formed on a support substrate.

[Low Dielectric Insulating Film]

A low dielectric insulating film which is one of subjects to be polished in the invention will be explained. Previously, as an interlayer insulating film material of a semiconductor device, $SiO_2$ (specific dielectric constant about 4.1) is used. A dielectric constant of a low dielectric insulating film material in the invention is defined to be 3.0 or less.

A low dielectric insulating film used in the invention may be organic or inorganic, preferably organic-inorganic hybrid-based such as SiOC and MSQ, or organic polymer-based such as polyimide, and Teflon (registered trademark). These materials may have a fine pore. A film forming method may be plasma CVD or spin coating. A dielectric constant is preferably low, particularly preferably from 1.8 to 2.5. Examples include "Black Diamond (manufactured by Applied Materials, trademark)" of SiOC-plasma CVD manner, and organic polymer-based "SiLK (manufactured by Dow Chemical Company, trademark))".

[Wiring Metal Raw Material]

In the invention, a semiconductor which is a subject to be polished is preferably a semiconductor integrated circuit (hereinafter, conveniently, referred to as LSI) having a wiring composed of a copper metal and/or a copper alloy, particularly preferably a copper alloy. A copper alloy containing silver among a copper alloy is further preferable. A content of silver contained in a copper alloy is preferably 40% by mass or less, particularly 10% by mass or less, further preferably 1% by mass or less, and the most excellent effect is exerted in a copper alloy having a silver content in a range of from 0.0001 to 0.1% by mass.

[Thickness of Wiring]

In the invention, it is preferable that a semiconductor to be polished, for example, in a DRAM device system, is LSI having a wiring of 0.15 μm or less, particularly 0.10 μm or less, further 0.08 μm or less and, on the other hand, in a MPU device system, is 0.12 μm or less, particularly 0.09 μm or less, further 0.07 μm or less as expressed by a half pitch. The polishing liquid of the invention exerts the particularly excellent effect on these LSIs.

(Barrier Metal)

Upon formation of a wiring in a semiconductor integrated circuit wafer, a barrier layer for preventing diffusion of copper is provided between a wiring composed of a copper, and an interlayer insulating film. A material constituting the barrier layer is preferably a metal material having a low resistance. For example, TiN, TiW, Ta, TaN, W, and WN are preferable and, among them, Ta and TaN are particularly preferable.

[Polishing Method]

A polishing liquid has the case where the polishing liquid is a concentrated liquid, and water is added upon use to dilute it to form a use liquid, the case where respective components are in the form of an aqueous solution described in the next item, they are mixed and, if necessary, water is added to dilute the polishing liquid to form a use liquid, and the case where the polishing liquid is prepared as a use liquid. A polishing method using the polishing liquid of the invention can be applied to any case, and is a polishing method of supplying a polishing liquid to a polishing pad on a polishing platen, contacting this with a surface to be polished, and subjecting a surface to be polished and a polishing pad to relative movement to perform polishing.

As a polishing apparatus, a general polishing apparatus having a polishing platen (equipped with a motor whose rotation number can be changed) to which a holder for holding a semiconductor substrate having a surface to be polished, and a polishing pad are applied, can be used. As a polishing pad, a non-woven fabric, an expanded polyurethane, and a porous fluorine resin which are commonly used can be employed without any limitation. Polishing condition has no limitation and, in order that a substrate is not flown out, a rotation rate of a polishing platen is preferably 200 rpm or less. A pressure at which a semiconductor substrate having a surface to be polished (film to be polished) is pushed against a polishing pad is preferably from 5 to 500 $g/cm^2$ and, in order to satisfy in wafer surface uniformity of a polishing rate and planarity of a pattern, more preferably from 12 to 240 $g/cm^2$.

During polishing, a metal-polishing liquid is continuously supplied to a polishing pad with a pump. This supply amount is not limited, but it is preferable that a surface of a polishing pad is usually covered with a polishing liquid. A semiconductor substrate after completion of polishing is washed well in running water, and is dried after water droplets attached to a semiconductor substrate have been removed using a spin dryer. In the polishing method of the invention, an aqueous solution used in dilution is the same as an aqueous solution described next. An aqueous solution is water containing at least one of an oxidizing agent, an acid, an additive, and a surfactant in advance, and components contained in an aqueous solution and components of a total of components of a metal-polishing liquid to be diluted are made to be components upon polishing using a metal-polishing liquid. When the liquid is used by diluting with an aqueous solution, a hardly-soluble component can be blended in a form of an aqueous solution, and a more concentrated metal-polishing liquid can be prepared.

As a method of diluting a concentrated metal-polishing liquid by adding water or an aqueous solution thereto, there is a method of mixing a concentrated metal-polishing liquid and water or an aqueous solution by joining midway a piping for supplying the liquid and a piping for supplying water or an aqueous solution, and supplying a mixed and diluted metal-polishing liquid to a polishing pad. For mixing, a method which is usually performed such as a method of passing through a narrow path under the pressure state to collide and mix liquids, a method of charging a filler such as a glass tube in a piping, and repeating separating and joining of streams of liquids, and a method of providing a wing which is rotated with a motive power in a piping can be adopted.

A rate of supplying a metal-polishing liquid to a wafer polishing surface is preferably from 10 to 1000 ml/min and, in order to satisfy planarity of a pattern, more preferably from 100 to 500 ml/min.

As a method of diluting a concentrated metal-polishing liquid with water or an aqueous solution and performing polishing, there is a method of independently providing a piping for supplying a metal-polishing liquid and a piping for supplying water or an aqueous solution, supplying a predetermined amount of a liquid to a polishing pad from each piping, and performing polishing while liquids are mixed by relative movement between a polishing pad and a surface to be polished. Alternatively, there is a method of placing a predetermined amount of a concentrated metal-polishing liquid and water or an aqueous solution into one container, and mixing them, supplying a mixed metal-polishing liquid to a polishing pad, and performing polishing.

Another polishing method of the invention is a method of dividing components to be contained in a metal-polishing liquid into at least two constitutional components and, upon use of them, adding water or an aqueous solution to dilute components, supplying this to a polishing pad on a polishing platen, and performing polishing by relative movement between a surface to be polished and a polishing pad while the polishing pad is contacted with a surface to be polished.

For example, an oxidizing agent as one constitutional component (A), and an acid, an additive, a surfactant and water as constitutional component (B) and, upon use thereof, the constitutional component (A) and the constitutional component (B) are diluted with water or an aqueous solution and used.

Alternatively, additives having low solubility are divided into two constitutional components (A) and (B) and, letting an oxidizing agent, an additive and a surfactant to be one constitutional component (A), and letting an acid, an additive, a surfactant and water to be one constitutional component (B) and, upon use of them, water or an aqueous solution is added to dilute the constitutional component (A) and the constitutional component (B), which is used. In this case, three pipings for supplying the constitutional component (A), the constitutional component (B) and water or an aqueous solution, respectively, are necessary and, as dilution and mixing, there is a method of connecting three pipings to one piping for supplying a polishing pad, and mixing them in that piping. In this case, after two pipings are connected, other one piping may be connected.

For example, this is a method of mixing a constitutional component containing a hardly-soluble additive and other constitutional component, and extending a mixing passway to maintain a dissolution time, thereafter, connecting a piping for water or an aqueous solution. Other mixing method is a method of directly introducing three pipings to a polishing pad, respectively, and mixing components by relative movement between a polishing pad and a surface to be polished as described above, or a method of mixing three constitutional components into one container, and supplying a diluted metal-polishing liquid therefrom. In the aforementioned polishing method, it is also possible that, a temperature of one constitutional component containing an oxidizing agent is set to be 40° C. or lower, other constitutional component is warmed to a range from room temperature to 100° C., one constitutional component, and other constitutional component or water or an aqueous solution are added to dilute them and, upon use, a temperature may be set to be 40° C. or lower after mixing. Since a temperature is high, solubility is increased and, therefore, this is a preferable method for increasing solubility of a raw material having low solubility of a metal-polishing liquid.

Since a raw material obtained by warming other component containing no oxidizing agent in a range of room temperature to 100° C. to dissolve the component is precipitated in a solution when a temperature is lowered in temperature, when the component, which has been lowered is used, it is necessary to warm it in advance to dissolve precipitates.

For this, a means to flow a constitutional component liquid obtained by warming to dissolve it, and a means to stir a liquid containing precipitates, flow this, and warm a piping to dissolve it can be adopted. Since when a temperature of one constitutional component in which a warmed component contains an oxidizing agent is elevated to 40° C. or higher, an oxidizing agent may be degraded, in the case where a warmed constitutional component, and one constitutional component containing an oxidizing agent for cooling this warmed constitutional component are mixed, a temperature is set to be 40° C. or lower.

In addition, in the invention, as described above, components of a metal-polishing liquid are divided into two or more, and they may be supplied to a polishing surface. In this case, it is preferable to divide components into a component containing oxide and a component containing an acid, and supply them. Alternatively, a metal-polishing liquid is converted into a concentrate, and diluting water may be supplied to a polishing surface separately.

A pad for polishing may be a non-form structure pad or a foam structure pad. In the former, a hard synthetic resin bulk material such as a plastic plate is used in a pad. In addition, in the latter, there are further three types of a closed-cell foam (wet foam), an open-cell foam (wet foam), and a bilayered complex (laminate) and, particularly, a bilayered complex (laminate) is preferable. Expansion may be uniform or ununiform.

Further, abrasives (e.g. ceria, silica, alumina, resin etc.) used in polishing may be contained. In addition, abrasives have a hardness of soft and hard, any of them may be used and, in a lamination system, it is preferable to use abrasives having different hardnesses in each layer. As a material, a non-woven fabric, an artificial leather, polyamide, polyurethane, polyester, and polycarbonate are preferable. In addition, a surface contacting with a polishing surface may be subjected to processes such as foaming lattice grooves/hole/concentric grooves/spiral grooves.

[Wafer]

A subject wafer on which CMP is performed with the metal-polishing liquid of the invention has a diameter of preferably 200 mm or more, particularly preferably 300 mm or more. When a diameter is 300 mm or more, the effect of the invention is remarkably exerted.

Example 1

The invention will be explained below by way of Examples. The invention is not limited by these Examples.

[Preparation of Specified Colloidal Silica (X-1 to X-6)]

Using colloidal silica having an average abrasive size of 5 nm [(X-3)], 50 nm [(X-1), (X-5), (X-6)], or 200 nm [(X-4)], 500 g of a 20 weight % aqueous dispersion of each of them was prepared, sodium hydroxide was added to adjust a pH to 9.5, thereafter, a 1 weight % ammonium aluminate aqueous solution at an amount adapting to a desired aluminum atom introduction amount was added at room temperature over 5 minutes while stirring, and the mixture was stirred for 3 hours. This washed by ultrafiltration and ion exchange, to prepare each abrasive.

Regarding an abrasive (X-2), ammonium was added to 500 g of a 20 weight % aqueous dispersion of colloidal silica having an average particle diameter of 50 nm, to adjust a pH to 9.5 and, thereafter, a 1 weight % solution of aluminum isopropoxy in ethanol was gradually added over 1 hour in the state where the dispersion was cooled with ice-water. After completion of addition, a temperature of the dispersion was returned to room temperature, stirring was further continued for 10 hours, and this washed by ultrafiltration and ion exchange to prepare an abrasive.

According to the aforementioned method, colloidal silicas (X-1) to (X-6) in which at least a part of silicon atoms on a surface was substituted with an aluminum atom shown in the following Table 1 were prepared.

A surface atom substitution amount of colloidal silica (number of introduced aluminum atoms/number of surface silicon atom sites) was estimated from a surface area calculated from a diameter of colloidal silica, a specific gravity of colloidal silica of 2.2, and the number of silicon atoms per surface area/(5 to 8/nm$^2$), postulating that added ammonium aluminate and aluminum isopropoxide were reacted 10%. Numerical values are also described in Table 1.

TABLE 1

| Abrasive | Colloidal silica size (nm) | Surface modifier | Number of introduced aluminum atoms/number of surface silicon atom site (%) |
|---|---|---|---|
| X-1 | 50 | Sodium aluminate | 1 |
| X-2 | 50 | Aluminum tetraisopropoxide | 1 |
| X-3 | 5 | Sodium aluminate | 1 |
| X-4 | 200 | Sodium aluminate | 1 |
| X-5 | 50 | Sodium aluminate | 0.05 |
| X-6 | 50 | Sodium aluminate | 20 |

[Preparation of Metal Polishing Liquid]

The thus obtained specified colloidal silica was formulated in an abrasive, and metal polishing liquids of Examples A1 to A8 were prepared at a composition shown below.

A pH of each composition was adjusted with ammonia and nitric acid.

Examples A1 to A8, Comparative Example A1

(Metal polishing liquid)

| | |
|---|---|
| Abrasive (particle described in Table 2) | (concentration described in Table 2) |
| Glycine (Acid) | 10 g/L |
| Hydrogen peroxide (oxidizing agent) | 1 weight % |
| Exemplified compound (I-8) (heterocyclic aromatic ring compound) | 0.05 g/L |
| Additive (compound described in Table 2) | (Amount described in Table 2) |
| Pure water was added to a total amount | 1000 mL |
| PH (adjusted with aqueous ammonia and nitric acid) | (pH described in Table 2) |

TABLE 2

| | Abrasive | Abrasive concentration (weight %) | pH | Additive and addition amount |
|---|---|---|---|---|
| Example A1 | X-1 | 0.1 | 6 | None |
| Example A2 | X-2 | 0.1 | 6 | None |
| Example A3 | X-3 | 0.1 | 6 | None |
| Example A4 | X-4 | 0.1 | 6 | None |
| Example A5 | X-5 | 0.1 | 6 | None |
| Example A6 | X-6 | 0.1 | 6 | None |
| Example A7 | X-1 | 0.1 | 8 | None |
| Example A8 | X-1 | 0.1 | 6 | Tetramethyl ammonium hydroxide: 8 g/L |
| Comparative Example A1 | Colloidal silica (50 nm) | 0.1 | 6 | None |

Examples A9 to A13

(Metal polishing liquid)

| | |
|---|---|
| Abrasive (particle described in Table 3) | (concentration described in Table 3) |
| Hydroxyethyliminodiacetic acid (acid) | 10 g/L |
| Hydrogen peroxide (oxidizing agent) | 1 weight % |
| Heterocyclic aromatic ring compound (compound described in Table 3) | (amount described in Table 3) |
| Additive (compound described in Table 3) | (amount described in Table 3) |
| Pure water was added to total amount | 1000 mL |
| PH (adjusted with aqueous ammonia and nitric acid) | (pH described in Table 3) |

TABLE 3

| | Abrasive | Abrasive concentration (weight %) | pH | Heterocyclic aromatic ring compound and addition amount | Other additive and addition amount |
|---|---|---|---|---|---|
| Example A9 | X-1 | 0.1 | 6 | (I-6) 0.02 g/L | Polyacrylic acid: 1 g/L |
| Example A10 | X-1 | 0.1 | 6 | (I-6) 0.02 g/L | Taurine: 20 g/L |
| Example A11 | X-1 | 1 | 6 | (I-6) 0.02 g/L | Taurine: 20 g/L |
| Example A12 | X-1 | 0.1 | 6 | (I-6) 0.02 g/L | Taurine: 20 g/L Ammonium phosphate: 7 g/L |
| Example A13 | X-1 | 0.1 | 6 | (I-14) 0.02 g/L | Taurine: 20 g/L Ammonium phosphate: 7 g/L |

Examples A14, A15

According to the same manner as that of Example A10 except that hydroxyethyliminodiacetic acid 5 g/L and dihydroxyethylglycine 10 g/L were added in place of hydroxyethyliminodiacetic acid 10 g/L, a metal polishing liquid of Example A14 was prepared.

In addition, according to the same manner as that of Example A10 except that dihydroxyethylglycine 20 g/L was added in place of hydroxyethyliminodiacetic acid 10 g/L, and taurine was not added, a metal polishing liquid of Example A15 was prepared.

Using each metal polishing liquid obtained as described above as a polishing liquid, the following polishing test was performed to assess the liquid.

[Evaluation of Abrasive Aggregation in Polishing Waste]

Using "LGP-613" manufactured by Lapmaster SFT Corporation as a polishing apparatus, a film provided on each wafer was polished under the following condition while a slurry was supplied.

Substrate: 8 inch silicon wafer equipped with copper film

Table rotation number: 50 rpm

Head rotation number: 50 rpm

Polishing pressure: 168 hPa

Polishing pad: Model IC-1400 manufactured by Rodel Nitta Company

Slurry supplying rate: 200 ml/min

A waste liquid after polishing was recovered, and a transmission spectrum was measured using a spectrophotometer. By utilizing the fact that as particles are aggregated, an optical concentration at 400 nm grows larger as compared with at 340 nm, abrasive aggregation was assessed using, as a measure, a ratio (turbidity ratio) of an optical concentration (ABS) at 340 nm and an optical concentration (ABS) at 400 nm. Results are shown in Table 4.

TABLE 4

|  | Turbidity ratio (400 nm/340 nm) |
| --- | --- |
| Example A1 | 0.08 |
| Example A2 | 0.07 |
| Example A3 | 0.05 |
| Example A4 | 0.25 |
| Example A5 | 0.16 |
| Example A6 | 0.13 |
| Example A7 | 0.14 |
| Example A8 | 0.16 |
| Example A9 | 0.08 |
| Example A10 | 0.07 |
| Example A11 | 0.19 |
| Example A12 | 0.06 |
| Example A13 | 0.07 |
| Example A14 | 0.06 |
| Comparative Example A1 | 0.35 |

From Table 4, it was confirmed that, when the metal polishing liquid of the invention was used, particle aggregation after polishing was suppressed. Thereby, a polishing flaw, a polishing residue, and reduction in a polishing rate due to aggregated abrasives can be considerably reduced.

Example 2

Preparation of Specified Colloidal Silica (Y-1)

Aqueous ammonia was added to 1000 g of a 20 mass % aqueous dispersion of colloidal silica (trade name: Quotron PL-3, manufactured by Fuso Chemical Co., Ltd.) having an average abrasive size (average primary particle diameter) of 35 nm, obtained by hydrolyzing teteraethoxysilane, to adjust a pH to 9.0, thereafter, 15.9 g of an aqueous sodium aluminate solution having an $Al_2O_3$ concentration of 3.6% by mass and a $Na_2O/Al_2O_3$ mole ratio of 1.50 was slowly added at room temperature in a few minutes while stirring, and the mixture was stirred for 0.5 hour. The resulting sol was placed into a SUS autoclave apparatus, and heated at 130° C. for 4 hours, and passed through a column charged with a hydrogen-type strongly acidic cation exchange resin (Amberlite IR-120B manufactured by Rohm & Haas Company, Inc.) and a column charged with a hydroxy group-type strongly basic anion exchange resin (Amberlite IRA-410 manufactured by Rohm & Haas Company, Inc.) at room temperature at a space rate of 1 $h^{-1}$, and an initial fraction was cut.

A volume average particle diameter of specified colloidal silica (Y-1) was 40 nm, and an aluminum coverage amount obtained by the aforementioned method was 1%. In addition, in the specified colloidal silica (Y-1), increase in a viscosity and gelling after preparation were not seen.

[Preparation of Polishing Liquid]

Using the specified colloidal silica (Y-1) obtained as described above as an abrasive, metal polishing liquids of Examples B1 and B2, and Comparative Example B1 were prepared at the following Formulation. The pH of the composition was adjusted with ammonia and nitric acid.

Example B1

| Polishing liquid | |
| --- | --- |
| Abrasive (specified colloidal silica (Y-1)) | 5 g/L |
| 2-Methyl-4-isothiazoline-3-one (abbreviation: MIT) | 0.05 g/L |
| Glycine (acid) | 10 g/L |
| Exemplified compound (I-8) (Heterocyclic aromatic ring compound) | 0.05 g/L |
| Hydrogen peroxide | 15 g/L |

Example B2

According to the same manner as that of Example B1 except that 5-chloro-2-methyl-4-isothiazoline-3-one (abbreviation: CIT) was added in place of 2-methyl-4-isothiazoline-3-one in Example B1, a polishing composition of Example B2 was prepared.

Comparative Example B1

According to the same manner as that of Example B1 except that comparative colloidal silica (Y-2) (trade name: Quotron PL-3, manufactured by Fuso Chemical Co., Ltd., average primary particle diameter 35 nm) was used in place of specified colloidal silica (Y-1), and 2-methyl-4-isothiazoline-3-one was not added in Example B1, a polishing composition of Comparative Example B2 was prepared.

Comparative Example B2

According to the same manner as that of Example B1 except that the aforementioned comparative colloidal silica (Y-2) (average primary particle diameter: 35 nm) was used in place of specified colloidal silica (Y-1) in Example B1, a polishing composition of Comparative Example B2 was prepared.

Polishing liquid of Examples B1 and B2, and Comparative Examples B1 and B2 were prepared, and stored at room temperature for 6 months, and polishing was performed by the following polishing method to evaluate polishing performance (polishing rate, number of occurrence of dishing and scratch). Further, a shell life of each polishing composition was evaluated. Evaluation results are shown in Table 5.

Measurement of polishing rate: A film pressure was calculated from electric resistances before and after polishing. Specifically, the rate was measured by polishing rate (nm/min)={(thickness of copper film before polishing)−thickness of copper film after polishing)}/(polishing time).

in a polishing composition was measured with transmitted scattered light. Evaluation criteria is as follows.

—Evaluation Criteria—

A shelf life was assessed by an attenuation rate of a transmitted light intensity. When an attenuation rate after 6 months is 25% or more, a shelf life was determined to be 6 months or less.

TABLE 5

| | Abrasive | | (B) component or comparative | | Other additive and | Polishing rate | Dishing | Scratch number | |
|---|---|---|---|---|---|---|---|---|---|
| | Kind | Size (nm) | compound | pH | addition amount | (nm/min) | (nm) | (number) | Shelf life |
| Example B1 | Specified colloidal silica (Y-1) | 40 | MIT | 6 | Glycine: 10 g/L I-8: 0.05 g/L | 630 | 130 | None | 6 months or longer |
| Example B2 | Specified colloidal silica (Y-1) | 40 | CIT | 6 | Glycine: 10 g/L I-8: 0.05 g/L | 620 | 130 | None | 6 months or longer |
| Comparative Example B1 | Comparative colloidal silica (Y-2) | 35 | None | 6 | Glycine: 10 g/L I-8: 0.05 g/L | 630 | 180 | Many | Less than 6 months |
| Comparative Example B2 | Comparative colloidal silica (Y-2) | 35 | MIT | 6 | Glycine: 10 g/L I-8: 0.05 g/L | 620 | 160 | Many | Less than 6 months |

<Evaluation>

1. Polishing Rate

A polishing rate was calculated from conversion from electric resistances before and after polishing into a film thickness by the following equation.

Polishing rate (nm/min)={(thickness of copper film before polishing)−(thickness of copper film after polishing)}/(polishing time)

2. Dishing

A substrate for evaluation of dishing was prepared as followed: a silicon oxide film was patterned by a photolithography step and a reactive ion etching step to form a wiring groove having a width of from 0.09 to 100 μm and a depth of 600 nm, and a connecting pore, a Ta film having a thickness of 20 nm was formed by a sputtering method, subsequently, a copper film having a thickness of 50 nm was formed by a sputtering method, and a wafer on which a copper film having a total thickness of 1000 nm was formed, was cut into 6×6 cm by a plating method.

This substrate was polished under the aforementioned condition while a slurry was supplied to a polishing cloth of a polishing platen of a polishing apparatus, a step difference at overpolish 30% and 100 μm/100 μm Line/Space was measured using a needle-contact type profiler, and dishing was obtained.

3. Scratch Number

For measuring the number of scratches, the number of scratches per wafer was counted using Surfscan SP1 manufactured by KLA-Tencor Corporation and SEM Vision manufactured by Applied Materials, Inc. Evaluation criteria is as follows.

—Evaluation Criteria—

None scratch: less than 50 of flaws of 0.14 μm or larger per wafer

Many scratches: 50 or more of flaws of 0.14 μm or larger per wafer

4. Method of Evaluating Shelf Life

Using Turbiscan MA-2000 (manufactured by Eko Instruments Co., Ltd.), settlement-dispersion behavior of a particle As shown in Table 5, it is seen that polishing compositions of Examples containing specified colloidal silica, and a compound having an isothiazoline-3-one skeleton can attain excellent polishing performance and a very long shelf life.

Example 3

Examples C1 to C5, Comparative Examples C1 to C11

Preparation of Polishing Liquid

A metal polishing liquid having the following composition was prepared.

| | |
|---|---|
| Abrasive (the following abrasive Z-1 or abrasive Z-2 was used) | 3 g/L |
| Organic acid (compound described in the following Table 6) | 0.05 mol/L |
| Hydrogen peroxide (oxidizing agent, manufactured by Wako Pure Chemical Industries, Ltd.) | 15 g/L |
| Heterocyclic compound (compound described in the following Table 6) | 0.01 mol/L |
| Pure water (adjusted to a total amount of 1000 mL) | balancing amount |
| PH (adjusted with aqueous ammonia and nitric acid) | 7.5 |

(Abrasive)

Abrasive Z-1: colloidal silica (trade name: PL-2, manufactured by Fuso Chemical Co., Ltd.)

Abrasive Z-2: specified colloidal silica prepared described below

—Preparation of Abrasive Z-2—

Aqueous ammonia was added to 1000 g of a 20 mass % aqueous dispersion of colloidal silica having an average abrasive size to adjust a pH to 7.0, thereafter, 15.9 g of an aqueous sodium aluminate solution having an $Al_2O_3$ concentration of 3.6% by mass and a $Na_2O/Al_2O_3$ mole ratio of 1.50 was slowly added at room temperature in a few minutes while stirring, and the mixture was stirred for 0.5 hour. The resulting sol was placed into a SUS autoclave apparatus, heated at 130° C. for 4 hours, and passed through a column charged with a hydrogen group-type strongly acidic cation exchange resin (Amberlite IR-120B) and a column charged with a hydroxyl group-type strongly basic anion exchanged resin (Ambalite IRA-410) at room temperature at a space velocity of 1 $h^{-1}$, and an initial fraction was cut.

A volume average particle diameter (primary particle diameter) of the resulting abrasive Z-2 was 25 nm, and a surface atom coverage rate of colloidal silica obtained by the aforementioned method was 1%. In the abrasive Z-2, increase in a viscosity and gelling were not seen after preparation.

As described above, the abrasive Z-2 which is specified colloidal silica was prepared.

Using resulting respective metal polishing liquids of Examples and Comparative Examples, the following polishing test was performed, and a polishing rate, dishing, and in-plane uniformity of a surface to be polished were obtained. Results are shown in Table 6

(In-Plane Uniformity of Surface to be Polished)

Regarding fourty nine places on the copper blanket wafer surface, film thicknesses of a noble metal film before and after CMP were calculated from an electric resistance value to obtain a polishing rate, which was assessed by the following equation.

In-plane uniformity (%)=[(maximum polishing rate−minimum polishing rate)/(average polishing rate)×2]×100 having an $Al_2O_3$ concentration of 3.6 weight % and a $Na_2O/Al_2O_3$ mole ratio of 1.50 was slowly added at room temperature in a few minutes while stirring, and the mixture was stirred for 0.5 hour. The resulting sol was placed into a SUS autoclave apparatus, heated at 130° C. for 4 hours, and passed through a column charged with a hydrogen-type strongly acidic cation exchange resin (Amberlite IR-120B) and a column charged with a hydroxy group-type strongly basic anion exchange resin (Amberlite IRA-410) at room temperature at a space velocity of 1 $h^{-1}$, and an initial fraction was cut.

[Preparation of Specified Colloidal Silica (L-2)]

In preparation of specified colloidal silica (L-1), the sol was not subjected to heat treatment, and passed through a column charged with a hydrogen-type strongly acidic cation ion exchange resin (Amberlite IR-120B) and a column charged with a hydroxy group-type strongly basic anion exchange resin (Amberlite IRA-410) at room temperature at a space velocity of 1 $h^{-1}$, and an initial fraction was cut.

TABLE 6

| | Abrasive | Organic acid | Oxidizing agent | Heterocyclic compound | Polishing rate (nm/min) | Dishing (nm) | In-plane uniformity |
|---|---|---|---|---|---|---|---|
| Example C1 | Abrasive Z-2 | Compound (III-8) | Hydrogen peroxide | Compound (II-37) | 250 | 55 | 5.5 |
| Example C2 | Abrasive Z-2 | Compound (III-10) | Hydrogen peroxide | Compound (II-37) | 250 | 45 | 5 |
| Example C3 | Abrasive Z-2 | Compound (III-12) | Hydrogen peroxide | Compound (II-37) | 220 | 50 | 6 |
| Example C4 | Abrasive Z-2 | Compound (III-8) | Hydrogen peroxide | Benzotriazole | 240 | 75 | 7 |
| Example C5 | Abrasive Z-2 | Compound (III-12) | Hydrogen peroxide | Benzotriazole | 200 | 70 | 7.5 |
| Comparative Example C1 | Abrasive Z-1 | Glycine | Hydrogen peroxide | Compound (II-37) | 280 | 140 | 14 |
| Comparative Example C2 | Abrasive Z-1 | L-alanine | Hydrogen peroxide | Compound (II-37) | 260 | 130 | 11 |
| Comparative Example C3 | Abrasive Z-1 | L-glutamic acid | Hydrogen peroxide | Compound (II-37) | 200 | 160 | 15 |
| Comparative Example C4 | Abrasive Z-1 | Oxalic acid | Hydrogen peroxide | Compound (II-37) | 220 | 140 | 11 |
| Comparative Example C5 | Abrasive Z-1 | Compound (III-8) | Hydrogen peroxide | Compound (II-37) | 250 | 120 | 13 |
| Comparative Example C6 | Abrasive Z-1 | Compound (III-10) | Hydrogen peroxide | Compound (II-37) | 250 | 110 | 10 |
| Comparative Example C7 | Abrasive Z-1 | Compound (III-12) | Hydrogen peroxide | Compound (II-37) | 240 | 110 | 9 |
| Comparative Example C8 | Abrasive Z-2 | Glycine | Hydrogen peroxide | Compound (II-37) | 280 | 130 | 13 |
| Comparative Example C9 | Abrasive Z-2 | L-alanine | Hydrogen peroxide | Compound (II-37) | 260 | 120 | 10 |
| Comparative Example C10 | Abrasive Z-2 | L-glutamic acid | Hydrogen peroxide | Compound (II-37) | 200 | 140 | 14 |
| Comparative Example C11 | Abrasive Z-2 | Oxalic acid | Hydrogen peroxide | Compound (II-37) | 220 | 130 | 9.5 |

As apparent from Table 6, it is seen that, a wafer for which polishing was performed using a metal polishing liquid of Examples 1C to 5C containing specified colloidal silica (abrasive Z-2), specified amino acid, and an oxidizing agent has low dishing and excellent in-plane uniformity as compared with use of a metal polishing liquid of Comparative Examples 1C to 11C.

Particularly, it is seen that Examples 1C to 3C using compound (II-37) as a heterocyclic compound which is a preferable arbitrary component exert the more remarkable effect.

Example 4

Preparation of Specified Colloidal Silica (L-1)

Aqueous ammonia was added to 1000 g of a 20 mass % water dispersion of colloidal silica to adjust a pH to 9.0, thereafter, 15.9 g of an aqueous sodium aluminate solution Increase in a viscosity, and gelling were not seen in the resulting specified colloidal silicas L-1 to L-2.

A surface atom covering rate (number of introduced aluminum atoms/number of surface silicon atom sites) of the thus obtained specified colloidal silica was obtained as follows:

First, an amount of consumed sodium aluminate was calculated from unreacted sodium aluminate remaining after a reaction, of sodium aluminate added to a dispersion. Postulating that this consumed sodium aluminate reacted 100%, a surface atom substitution rate was estimated from a surface area calculated from a diameter of colloidal silica, a specific gravity of colloidal silica of 2.2, and the number of silanol groups (5 to 8/nm$^2$) per unit surface area. An aluminum coverage amount of specified colloidal silica obtained by the above method was 1%. And, a size (volume-equivalent diameter) of specified colloidal silica was measured by the aforementioned method, and was found to be 30 nm.

Examples D1 to D9

Preparation of Metal Polishing Liquid

Using the specified colloidal silica obtained as described above as an abrasive, metal polishing liquids (I) to (9) of Examples were prepared according to the following Formulation.

—Composition of Metal Polishing Liquid—

| | | |
|---|---|---|
| (a) | Specified colloidal silica (average particle diameter 30 nm) | 5 g/L |
| (b) | Organic acid: glycine | 10 g/L |
| (c) | Passivated film forming agent: benzotriazole (BTA) | 1 g/L |
| (d) | Surfactant or water-soluble polymer shown in Table 7 | amount described in Table 7 |
| (e) | Oxidizing agent: 30% hydrogen peroxide | 15 g/L |

Pure water was added to a total amount of 1000 mL, and a pH was adjusted to 4.5 using nitric acid and ammonia. The (e) oxidizing agent was added to a polishing liquid immediately before polishing.

Using each metal polishing liquid obtained as described above, polishing was performed by the following polishing method.

(Polishing Method: Polishing Using 8 Inch Wafer)

Using "LGP-613" manufactured by Lapmaster SFT Corporation as a polishing apparatus, a copper film provided on each wafer was polished under the following condition while a polishing liquid was supplied.

Subject to be polished (substrate): 8 inch silicon wafer with copper film

Table rotation number: 50 rpm

Head rotation number: 50 rpm

Polishing pressure: 168 hPa

Polishing pad: Model IC-1400 manufactured by Rodel Nitta Company

Polishing liquid supplying rate: 200 ml/min
    (Evaluation)

(1) Evaluation of Remaining Abrasive on Surface to be Polished After Polishing

Each wafer after polishing was sufficiently washed with water, and dried, and the wafer surface state was observed using a scanning electron microscope "S-4800" manufactured by Hitachi Technologies and Services, Ltd. to confirm an abrasive remaining on a wafer surface. Evaluation criteria is as follows. Results are shown in Table 7.

—Evaluation Criteria—

A: State where little abrasive is present (around less than 10 per $cm^2$)

B: State where abrasive is confirmed (around 10 or more and less than 1000 per $cm^2$)

C: State where abrasive is confirmed over a surface (around 1000 or more per $cm^2$)

(2) Evaluation of Occurrence of Precipitation-Aggregation of Metal Polishing Liquid with Time After each metal polishing liquid was allowed to stand for 24 hours, the presence or the absence of occurrence of precipitation-aggregation in a polishing liquid was confirmed visually. Evaluation criteria is as follows. Results are shown in Table 7.

—Evaluation Criteria—

A: Precipitation is not confirmed visually

C: Precipitation is confirmed visually

TABLE 7

| | polishing liquid | (a) component | (b) component | (c) component | (d) component Kind | Content (mass %) | Evaluation Remaining abrasive | Precipitation-aggregation |
|---|---|---|---|---|---|---|---|---|
| Example D1 | Polishing liquid (I) | Specified colloidal silica (L-1) | Glycine | Benzotriazole | Cetyltrimethylammonium hydroxide | 0.01 | A | A |
| Example D2 | Polishing liquid (2) | Specified colloidal silica (L-1) | Glycine | Benzotriazole | | 0.001 | A | A |
| Example D3 | Polishing liquid (3) | Specified colloidal silica (L-2) | Glycine | Benzotriazole | Hexadecyltrimethylammonium hydroxide | 0.03 | A | A |
| Example D4 | Polishing liquid (4) | Specified colloidal silica (L-2) | Glycine | Benzotriazole | Emulgen A60*[1] (Polyoxyethylenedistyrene phenyl ether) | 0.03 | A | A |
| Example D5 | Polishing liquid (5) | Specified colloidal silica (L-2) | Glycine | Benzotriazole | | 0.001 | A | A |
| Example D6 | Polishing liquid (6) | Specified colloidal silica (L-2) | Glycine | Benzotriazole | | 0.000001 | B | A |
| Example D7 | Polishing liquid (7) | Specified colloidal silica (L-1) | Glycine | Benzotriazole | Polyoxyethylene lauryl ether | 0.003 | A | A |
| Example D8 | Polishing liquid (8) | Specified colloidal silica (L-2) | Glycine | Benzotriazole | Polyoxyethylene octyl phenyl ether | 0.01 | A | A |
| Example D9 | Polishing liquid (9) | Specified colloidal silica (L-2) | Glycine | Benzotriazole | | 0.001 | A | A |

*[1]Nonionic surfactant manufactured by Kao Corporation

As shown in Table 7, it was confirmed that, in metal polishing liquids of Examples in which the component relating to the invention (at least one of a cationic surfactant, a nonionic surfactant, or a water-soluble polymer) was added to a metal polishing liquid containing specified colloidal silica, remaining of an abrasive on a surface to be polished is suppressed after polishing. In addition, it was confirmed that an addition amount of at least one of a cationic surfactant, a nonionic surfactant, or a water-soluble polymer is particularly preferably in a range of 0.0001% by mass to 1% by mass from a viewpoint of suppression of remaining of an abrasive on a surface to be polished, and dispersion stability of an abrasive in a polishing liquid.

According to the invention, a metal polishing liquid, wherein an aggregation of abrasives caused by grinding products from polishing is suppressed and a stable high polishing rate can be obtained even when the process fluctuates, is provided.

According to the invention, also a polishing liquid which is excellent in polishing performance and has a long shelf life can be provided.

According to the invention, further a metal polishing liquid which is used in Chemical Mechanical Polishing in manufacturing of a semiconductor device, attains low dishing of a subject to be polished, and can perform polishing excellent in in-plane uniformity of a surface to be polished, and a Chemical Mechanical Polishing method using the metal polishing liquid can be provided.

The invention also includes the following embodiments.

<1> A metal polishing liquid comprising an oxidizing agent and colloidal silica in which at least a part of a surface of the colloidal silica is covered with aluminum atoms.

<2> The metal polishing liquid according to item <1>, wherein a primary particle diameter of the colloidal silica is from 10 to 60 nm.

<3> The metal polishing liquid according to any one of items <1> or <2>, wherein the colloidal silica is included in an amount of from 0.001 to 0.5% by weight.

<4> The metal polishing liquid according to any one of items <1> to <3>, wherein the pH of the liquid is from 2 to 7.

<5> The metal polishing liquid according to any one of items <1> to <4>, further comprising a compound having a carboxyl group and a secondary or tertiary amino group in a molecule.

<6> The metal polishing liquid according to any one of <1> to <5>, further comprising a heterocyclic aromatic ring compound having 4 or more nitrogen atoms, and having any one of a carboxyl group, a sulfo group, a hydroxyl group or an alkoxy group as a substitutent.

<7> The metal polishing liquid according to any one of items <1> to <6>, further comprising a quaternary alkylammonium compound.

<8> The metal polishing liquid according to any one of items <1> to <7>, further comprising a water-soluble polymer.

<9> The metal polishing liquid according to any one of items <1> to <8>, further comprising any one of phosphoric acid or phosphorus acid.

<10> The metal polishing liquid according to any one of items <1> to <9>, further comprising a compound having at least one amino group and at least one sulfo group in a molecule.

<11> The metal polishing liquid according to item <1>, further comprising at least one of a cationic surfactant, a nonionic surfactant or a water-soluble polymer.

<12> The metal polishing liquid according to item <1>, further comprising an organic acid, a passivated film forming agent and at least one of a cationic surfactant, a nonionic surfactant or a water-soluble polymer.

<13> The metal polishing liquid according to item <12>, wherein a content of the at least one of a cationic surfactant, a nonionic surfactant or a water-soluble polymer is in a range of from 0.0001% by mass to 1% by mass based on a total mass of the metal polishing liquid.

<14> A metal polishing liquid according to item <1>, further comprising at least one compounds having an isothiazoline-3-one skeleton.

<15> The metal polishing liquid according to item <14>, wherein the at least one compound having an isothiazoline-3-one skeleton is 2-methyl-4-isothiazoline-3-one.

<16> The metal polishing liquid according to item <1>, further comprising an amino acid represented by the following Formula (I):

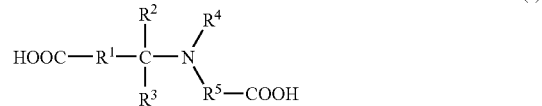

Formula (I)

wherein, in the Formula (I), $R^1$ represents a single bond, an alkylene group, or a phenylene group; $R^2$ and $R^3$ each independently represent a hydrogen atom, a halogen atom, a carboxyl group, an alkyl group, a cycloalkyl group, an alkenyl group, an alkynyl group, or an aryl group; $R^4$ represents a hydrogen atom, a halogen atom, a carboxyl group, an alkyl group, or an acyl group; and $R^5$ represents an alkenyl group. Provided that when $R^5$ represents —CH2-, $R^1$ is not a single bond, or $R^4$ is not a hydrogen atom.

<17> The metal polishing liquid according to item <16>, further comprising a heterocyclic compound.

<18> The metal polishing liquid according to any one of items <16> to <17>, wherein a primary particle diameter of the colloidal silica is in a range of from 10 nm to 60 nm.

<19> The metal polishing liquid according to any one of items <16> to <18>, wherein the pH of the liquid is from 2 to 8.

<20> A Chemical Mechanical Polishing method, comprising contacting the metal polishing liquid of any one of items <16> to <19> with a surface to be polished, and performing polishing by relative movement of the surface to be polished and a polishing surface of a polishing pad.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. A metal polishing liquid comprising an oxidizing agent and colloidal silica in which a part of a surface of the colloidal silica is covered with aluminum atoms;
wherein the surface atom covering rate of the colloidal silica is from 0.1 to 10%,
wherein the metal polishing liquid further comprises an amino acid represented by the following Formula (I):

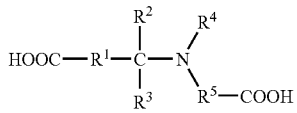

Formula (I)

wherein, in the Formula (I), $R^1$ represents a single bond, an alkylene group, or a phenylene group; $R^2$ and $R^3$ each independently represent a hydrogen atom, a halogen atom, a carboxyl group, an alkyl group, a cycloalkyl group, an alkenyl group, an alkynyl group, or an aryl group; $R^4$ represents a hydrogen atom, a halogen atom, a carboxyl group, an alkyl group, or an acyl group; $R^5$ represents an alkenyl group; and when $R^5$ represents —$CH_2$—, $R^1$ is not a single bond or $R^4$ is not a hydrogen atom.

2. The metal polishing liquid according to claim 1, further comprising a heterocyclic compound.

3. The metal polishing liquid according to claim 1, wherein a primary particle diameter of the colloidal silica is in a range of from 10 nm to 60 nm.

4. The metal polishing liquid according to claim 1, wherein the pH of the liquid is from 2 to 8.

5. A chemical mechanical polishing method, comprising contacting the metal polishing liquid of claim 1 with a surface to be polished, and performing polishing by relative movement of the surface to be polished and a polishing surface of a polishing pad.

* * * * *